(12) United States Patent
Bojarczuk, Jr. et al.

(10) Patent No.: US 6,333,067 B2
(45) Date of Patent: Dec. 25, 2001

(54) SELECTIVE GROWTH OF FERROMAGNETIC FILMS

(75) Inventors: Nestor A. Bojarczuk, Jr., Poughkeepsie; Peter R. Duncombe, Peekskill; Supratik Guha, Yorktown Heights; Arunava Gupta, Valley Cottage; Joseph M. Karasinski, Yorktown Heights; Xinwei Li, Mohegan Lake, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/879,156

(22) Filed: Jun. 13, 2001

Related U.S. Application Data

(62) Division of application No. 09/172,659, filed on Oct. 15, 1998.

(51) Int. Cl.$^7$ ........................................... B05D 5/12
(52) U.S. Cl. ................. 427/130; 427/131; 427/132; 427/256; 427/270; 427/271; 427/331; 438/686
(58) Field of Search ................... 427/130–132, 427/256, 270, 271, 331; 438/686

(56) References Cited

PUBLICATIONS

R.C. DeVries, "Epitaxial Growth of CrO2", Mat. Res. Bull. vol. 1, pp. 83–93, 1966. Pergamon Press, Inc. (No month avail.).

Ishibashi, et al., "Epitaxial Growth of Ferromagnetic CrO2 Films in Air", Mat. Res. Bull. vol. 14, pp. 51–57, 1979, Pergamon Press, Inc. (No month avail.).

Ishibashi et al., "Epitaxial Growth of CrO2 on Sapphire in Air", Japan J. Appl. Phys. vol. 17 (1978), No. 1, pp. 249–250. (No month avail.).

Karlheinz Schwarz, "CrO2 Predicted as a Half–Metallic Ferromagnet", J. Phys. F: Met. Phys. 16 (1986) pp. L211–L215. (No month avail.).

Kamper, et al., "CrO2–A New Half–Metallic Ferromagnet?", vol. 59, No. 24, Physical Review Letters, Dec. 14, 1987, pp. 2788–2791.

Tsaur et al., "Low–dislocation–density GaAs epilayers grown on Ge–coated Si substrates by means of lateral epitaxial overgrowth", Appl. Phys. Lett. 41(4), Aug. 15, 1982, pp. 347–349.

*Primary Examiner*—Bernard Pianalto
(74) *Attorney, Agent, or Firm*—Marian Underweiser, Esq.; McGinn & Gibb, PLLC

(57) ABSTRACT

A method of forming the device, includes selective area deposition of a ferromagnetic material on a substrate. The substrate surface is partially covered with material having a crystal structure having at least one symmetry relation with the crystal structure of the ferromagnetic material.

23 Claims, 11 Drawing Sheets

SELECTIVE GROWTH OF FERROMAGNETIC FILMS

CROSS-REFERENCE TO RELATED APPLICATION

The present Application is a Divisional Application of U.S. patent application Ser. No. 09/172,659, filed on Oct. 15, 1998. The present application is related to U.S. Pat. No. 6,146,755, assigned to the present assignee, and incorporated herein by reference.

BACKGROUND OF THE INVENTION

1. Field of the Invention

The present invention generally relates to a method for depositing a ferromagnetic compound, such as chromium dioxide ($CrO_2$), in thin film form in a selective fashion over a substrate, such that the growth occurs only above specific regions of the substrate that have been appropriately modified.

More specifically, the invention relates to a method for depositing such a ferromagnetic compound in a selective growth process for a plurality of applications including magnetic memory and storage-based devices, as well as other devices.

2. Description of the Related Art

Conventional systems utilize chromium dioxide ($CrO_2$) as an important ferromagnetic material which is used, for example, as a particulate magnetic recording media. Chromium dioxide has the rutile crystal structure which is tetragonal with lattice parameters of a=4.423 Å and c=2.917 Å. The chromium ions are in the $Cr^{+4}$ state with the electronic configuration $[Ar]3d^2$ with a magnetic moment of 2 $\mu_B$ per ion.

Because of its half-metallic nature, where the majority spin electrons have a metallic character and the minority spin electrons have a semiconducting character (e.g., see K. Schwarz, J. Phys. F 16, 211 (1986)), chromium dioxide also is ideally suited for use in magnetic tunnel junction (MTJ) devices. Suitable applications for $CrO_2$ include, as a media for magnetic storage, and as a component in magnetic tunnel junction devices.

Recently, there have been attempts to deposit $CrO_2$ in the form of thin films (though not in a selective area fashion), as described, for example, in R. C. DeVries, "Epitaxial Growth of $CrO_2$", *Mat. Res. Bull.* 1, 83 (1966); S. Ishibashi, T. Namikawa, and M. Satou, "Epitaxial Growth of $CrO_2$ in Air", *Japan J. Appl. Phys.* 17, 249 (1978); S. Ishibashi, T. Namikawa, and M. Satou, "Epitaxial Growth of Ferromagnetic $CrO_2$ Films in Air", *Mat. Res. Bull.* 14, 51 (1979); and K. P. Kamper, W. Schmitt, G. Guntherodt, R. J. Gambino, and R. Ruff, "$CrO_2$—A New Half-Metallic Ferromagnet?", *Phys. Rev. Lett.* 59, 2788 (1987).

However, these studies have been confined to the uniform deposition of $CrO_2$ that covered the entire substrate (e.g., a substantially continuous deposition). Further, selective area growth of $CrO_2$ has not been attempted on predetermined locations (e.g., those that could be patterned) on the substrate surface with arbitrary size dimensions. Thus, control in the deposition of such films has been limited, and thus the applications of such films have been limited.

Selective area growth, which consists of depositing a material over a substrate in such a fashion that material is deposited only on specific regions of substrate that have been appropriately modified, is an established technique in the field of compound semiconductors and metal deposition.

In the area of semiconductor deposition, selective growth has been used for the production of higher quality thin film optoelectronic devices for making better light emitters, and in the case of metals, selective growth has been used for different applications such as plugs for hole filling in Si technology. The particular technical details for selective area growth of various systems are quite diverse due to the different chemistries involved.

Thus, as noted above, selective area growth has not been used for applications in ferromagnetic thin films or in forming any substrates used in magnetic memory applications, for example.

The conventional method of patterning blanket thin films using photolithography and etching is difficult in the case of $CrO_2$ since it is not readily etched in a reactive plasma or with wet chemicals. Hence, selective area growth would be a preferred approach since it requires no subsequent patterning steps.

SUMMARY OF THE INVENTION

In view of the foregoing and other problems of the conventional structures and methods, it is an object of the present invention to provide a structure and method for allowing selective area deposition of a ferromagnetic material such as $CrO_2$.

In a first aspect of the invention, a method of forming a magnetic device, includes selective area deposition of a ferromagnetic material on a substrate, part of the substrate surface being covered with material with a crystalline structure that shares one or more symmetry relations with the crystal structure of the ferromagnetic material.

These symmetry relations do not have to be the characteristic symmetry element that defines membership into the particular crystal system. As an example, a substrate is considered that is hexagonal, so that its characteristic symmetry element is a 6-fold rotation axis. Further considered is a ferromagnetic thin film that is tetragonal so that its characteristic symmetry element is a single 4-fold rotation axis. In this case, the symmetry element that these two structures share is that of 2-fold rotation symmetry about these axes since it is obvious that both the 6-fold axis (of the hexagonal structure) and the 4-fold axis (of the tetragonal structure) possess 2-fold symmetry.

Generally, the technique utilizes the idea of deposition of $CrO_2$ on a surface by the reaction $CrO_3=CrO_2+½O_2$.

The present inventors have found that, at an appropriate substrate temperature, the above reaction will proceed only on certain surfaces, but the reaction will not occur on other surfaces. This discovery by the present inventors is the basis for a selective area growth process. If a substrate surface is patterned in the form of features consisting of two materials, A and B such that $CrO_2$ grows on A but not on B, then the spatial growth of $CrO_2$ can be controlled selectively by appropriately pre-patterning the substrate surface with features of A and B. The relationship between the surface symmetry of the two constituents is important. Thus, surfaces on which growth can occur will be from a crystalline system that is trigonal, monoclinic, or a system with a symmetry higher than monoclinic such as orthorhombic, tetragonal, or cubic; or a system with a symmetry higher than trigonal such as hexagonal—as long as one can define a symmetry relationship between $CrO_2$ and the substrate. Substrates on which growth will not occur will be amorphous such as $SiO_2$.

Thus, with the unique and unobvious features of the present invention, selective area growth can be used for applications of ferromagnetic thin films including magnetic memory applications.

BRIEF DESCRIPTION OF THE DRAWINGS

The foregoing and other objects, aspects and advantages will be better understood from the following detailed description of preferred embodiments of the invention with reference to the drawings, in which:

FIG. 10A shows a smooth, high quality microstructure of the selectively grown $CrO_2$ and FIG. 10(b) shows the lateral overgrowth that has occurred on the $SiO_2$.

DETAILED DESCRIPTION OF PREFERRED EMBODIMENTS OF THE INVENTION

Figure 1A:
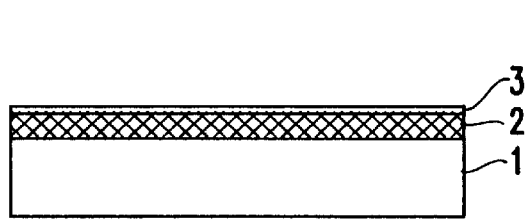
FIGS. 1A, 1B, 1C, 1D, 1E and 1F are schematic diagrams of a process of the present invention for magnetic tunnel junction device processing.

Referring now to the drawings, and more particularly to FIGS. 1A–10B, preferred embodiments of the present invention will be described.

Generally and as mentioned above, the present invention allows selective area deposition of a ferromagnetic material such as $CrO_2$. The technique utilizes the idea of deposition of $CrO_2$ on a surface by the reaction $CrO_3=CrO_2+\frac{1}{2}O_2$.

Specifically, at an appropriate substrate temperature the reaction will proceed only on certain surfaces, while it will not occur on other surfaces. This discovery is the basis for a selective area growth strategy.

As mentioned above, if a substrate surface is patterned in the form of features consisting of two materials, A and B such that $CrO_2$ grows on A but not on B, then upon growth the spatial growth of $CrO_2$ can be controlled selectively by appropriately pre-patterning the substrate surface with features of A and B.

For example, the present inventors have found that $CrO_2$ will deposit on a surface such as single crystal sapphire ($Al_2O_3$), or titanium oxide ($TiO_2$), but will not deposit upon a $SiO_2$ surface. In terms of crystal structure, sapphire is hexagonal, $TiO_2$ is tetragonal, and $CrO_2$ itself is tetragonal. $SiO_2$ is amorphous in nature. For $CrO_2$ deposition to occur on a surface, the crystal structure of that surface preferably should bear a symmetry relation with the crystal structure of $CrO_2$.

Specifically, the reason is that the $CrO_2$ phase itself is a metastable tetragonal phase. For the formation of a stable nuclei of $CrO_2$ on a surface, the interfacial energy at the $CrO_2$ nucleus/substrate surface should be low, since otherwise the energy cost for nucleus formation will be high. The existence of a symmetry relation between the substrate surface and the metastable $CrO_2$ phase will result in an epitaxial stabilization of the $CrO_2$ phase and the formation of stable nuclei as a consequence of a favorable interfacial energy.

In contrast, if there is no such symmetry relation, the interfacial energy cost will be high enough so that the reaction $CrO_3=CrO_2+\frac{1}{2}O_2$ cannot proceed (e.g., to the right of the equality above), and stable $CrO_2$ nuclei will not form. Hence, the relationship between the surface symmetry of the two constituents is important. Thus, substrates on which growth can occur will be from a crystalline system that is trigonal, monoclinic, or a system with a higher symmetry than monoclinic such as orthorhombic, tetragonal, or cubic; or a system with a higher symmetry than trigonal such as hexagonal as long as one can define a symmetry relationship between $CrO_2$ and the substrate. Substrates on which growth will not occur will be amorphous such as $SiO_2$ or the like (amorphous $Si_3N_4$, amorphous carbon, glass).

The process above is powerful, since it allows growing $CrO_2$ only at a specific desired location. There are many potential applications which would find great benefit with the concept of the invention. Two exemplary applications (e.g., magnetic tunnel junction device processing and growth of high quality $CrO_2$ layers) are described below.

Magnetic Tunnel Junction Device Processing

Tunnel junction devices, where the current flow is between the top and bottom magnetic electrode through a thin insulating barrier layer, must be patterned into small structures for testing. Such patterning is typically performed by using a multiple step patterning and etching process after growth of the bottom electrode, insulating barrier and the top electrode.

Normally, ion beam milling is used for etching the magnetic layers since no preferred reactive ion etching process exists for magnetic materials such as Co, NiFe, CoFe, etc. Redeposition during ion milling can lead to microshorts in the tunnel junction structure which will degrade the performance of the device. Moreover, by using ion milling, it is difficult to obtain a sharp etch profile and have an etch stop right below the barrier level.

In contrast, by using selective area growth, the processing can be made easier as shown in the schematics of FIGS. 1A–1F and FIGS. 2A–2F.

In a simplified process as shown in FIGS. 1A–1F, a substrate 1, preferably formed of $Al_2O_3$, $TiO_2$, silicon or the like is provided, as shown in FIG. 1A. A bottom magnetic $CrO_2$ layer 2 and a thin insulating barrier layer 3 (e.g., preferably $TiO_2$ and/or $Al_2O_3$, or the like ($SnO_2$) are deposited, e.g., by chemical vapor deposition in turn on the substrate 1. Preferably, the $CrO_2$ layer 2 has a thickness substantially within a range of approximately 200 Å to approximately 2000 Å, and the insulating barrier layer 3 has a thickness substantially within a range of approximately 10 Å to approximately 50 Å.

Figure 1D:
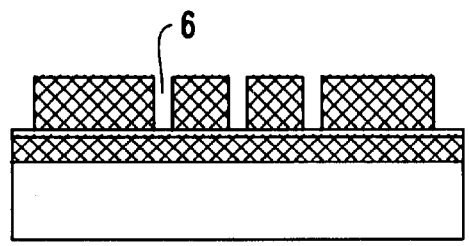
Figure 1B:
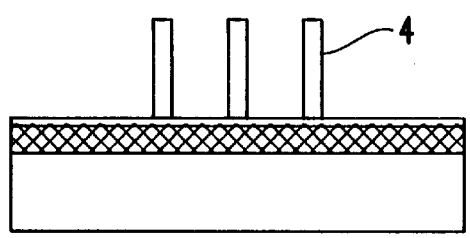
Figure 1E:
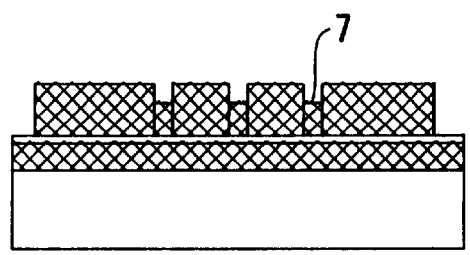
Figure 1C:
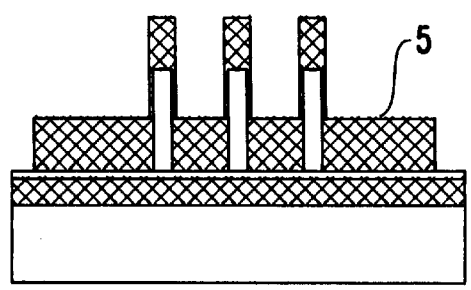
Figure 1F:
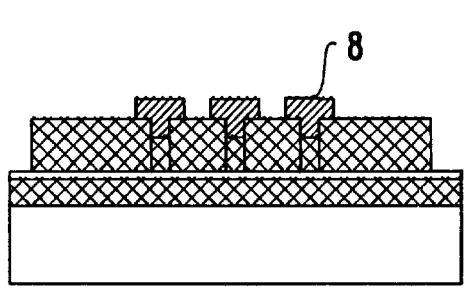

Next, as shown in FIGS. 1B–1C, after lithographically patterning the surface with a photoresist 4 or the like, a $SiO_2$ layer 5 is deposited. Preferably, the $SiO_2$ layer 5 has a thickness substantially within a range of approximately 500 Å to approximately 2000 Å.

Then, as shown in FIG. 1D, the photoresist 4 remaining is used as a lift-off stencil to open contact holes (e.g., vias) 6. A $CrO_2$ layer 7 is grown selectively in the opened vias 6 on layer 3 (e.g., the $TiO_2$ or $Al_2O_3$ surface 3). Preferably, the vias 6 are opened to a depth substantially within a range of approximately 0.3 μm to approximately 10 μm, and most preferably 2 μm. Preferably, the $CrO_2$ layer 7 has a thickness substantially within a range of approximately 100 Å to approximately 2000 Å, and most preferably 500 Å.

Finally, a metallization layer 8 (e.g. Au, Ag, Pt) is deposited on the $CrO_2$ layer 7 by sputtering or evaporation and portions of the upper surface of the $SiO_2$ layer 5, and subsequently patterned to make contact to the top electrode. Preferably, the metallization layer 8 has a thickness within a range of approximately 1000 Å to approximately 3000 Å, and most preferably 1500 Å. The selective growth of $CrO_2$ is preferably carried out by chemical vapor deposition. The above-described process is especially useful for magnetic tunnel junction device processing.

Figure 2A:
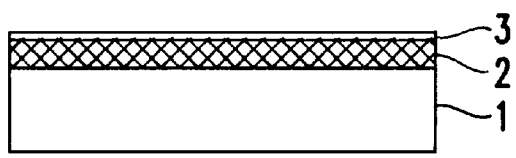
FIGS. 2A, 2B, 2C, 2D, 2E, 2F and 2G are schematic diagrams of another process of the present invention for magnetic tunnel junction device processing.
Figure 2B:
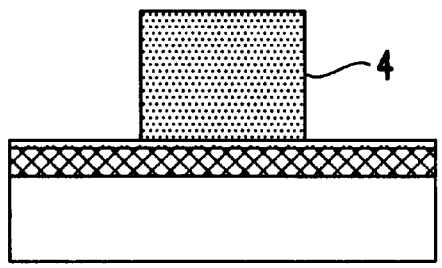
Figure 2E:
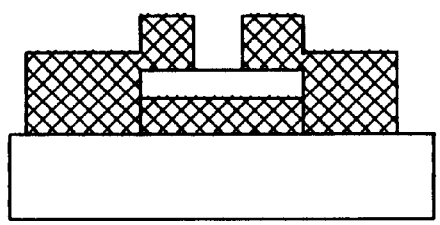
Figure 2C:
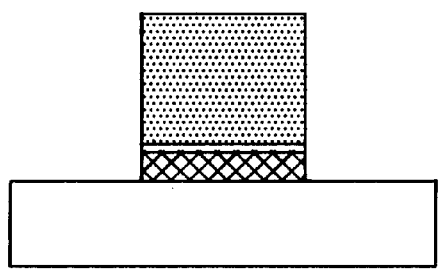
Figure 2F:
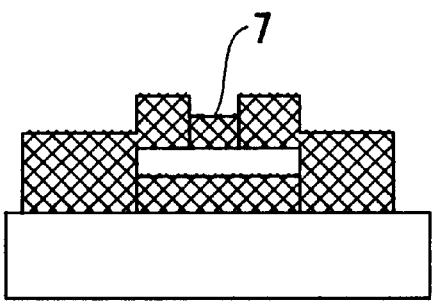
Figure 2D:
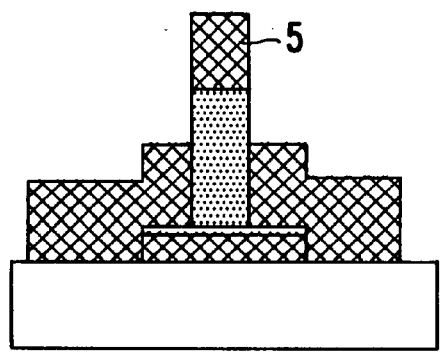
Figure 2G:
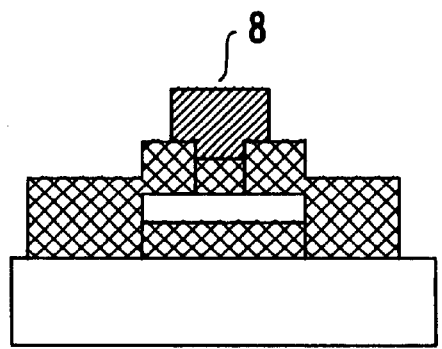

An alternative process, used only for MTJ, where the bottom magnetic electrode and barrier (e.g., layers 2 and 3) are photolithographically patterned (e.g., see FIG. 2B illustrating the deposition of the photoresist 4 and FIG. 2C which illustrates the structure after ion mill etching or the like) prior to the deposition of $SiO_2$ layer 5 (there is an additional photolithography step after 2C to define the lift-off vias for growth of top, $CrO_2$ before the deposition of $SiO_2$ as depicted in 2D and subsequent selective growth of the $CrO_2$ layer 7 and metallization layer 8, is shown in FIGS. 2A–2G which use the same reference numerals as FIGS. 1A–1F for like elements. The remaining steps (e.g., shown in FIGS. 2D–2G are substantially the same as in FIGS. 1C–1F.

Thus, with the first embodiment, selective area deposition of a ferromagnetic material such as $CrO_2$ is optimized for magnetic memory applications and the like.

Growth of High Quality $CrO_2$ Layers $CrO_2$ films preferably should have high crystalline quality for improved tunneling device performance. However, when $CrO_2$ is grown on sapphire ($Al_2O_3$) or $TiO_2$, the thin film contains many defects that result from lattice mismatch. The presence of planar defects may influence the magnetic and magnetotransport properties of the films.

Figure 3A:
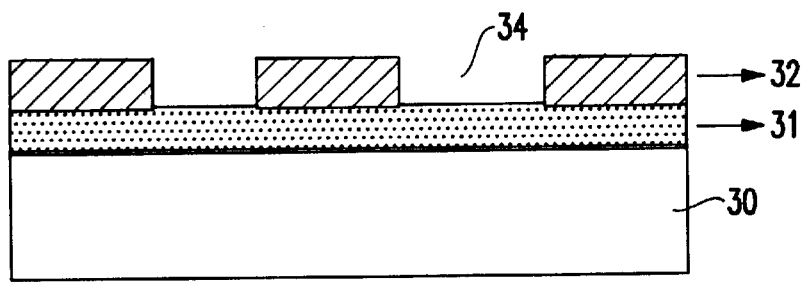
FIGS. 3A, 3B and 3C are schematics showing a process for growth of high quality $CrO_2$ layers according to the present invention.
Figure 3B:
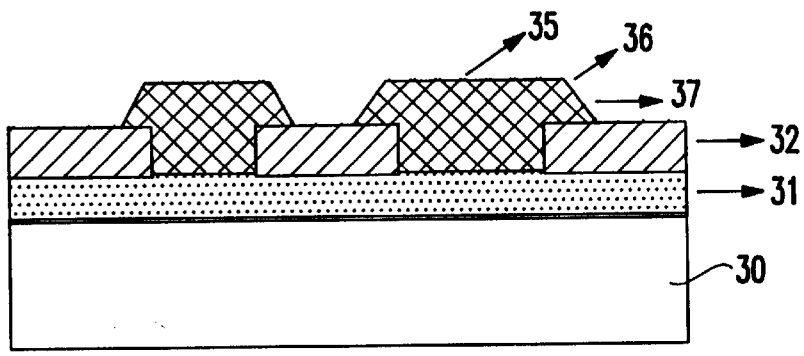
Figure 3C:
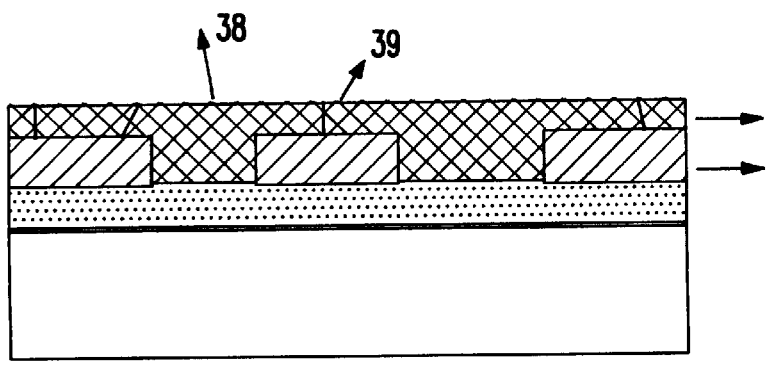

Using selective area growth, and utilizing the property of lateral overgrowth that arises from selective area growth, high-quality, defect-free $CrO_2$ layers may be obtained, as shown in FIGS. 3A–3C.

Essentially, a single crystal $TiO_2$ or sapphire substrate 31 (or a thin film of TiO2 or sapphire on a silicon substrate 30 as shown) is coated with a layer of $SiO_2$ 32. Preferably, there is no layer between 31 and 30. One may either start with a single crystal $TiO_2$ or sapphire substrate, or deposit a $TiO_2$ film on a Si substrate. It is important to provide a $TiO_2$ or sapphire surface for $CrO_2$ growth. Preferably, layer 31, if it is a thin film and not a substrate itself, has a thickness substantially within a range of approximately 1000 Å to approximately a few microns, and most preferably 1 micron, and layer 32 has a thickness substantially within a range of approximately 200 Å to approximately 1 micron, and most preferably 2000 Å.

Windows 34 (e.g., preferably having lateral dimensions of a few hundred angstroms to a few hundred microns) are opened up in the $SiO_2$ 32, as shown in FIG. 3A.

Thereafter, selective area growth is performed with deposited $CrO_2$ 35, as shown in FIG. 3B. Preferably, the $CrO_2$ deposition 35 has a thickness substantially within a range of approximately few hundred angstroms to approximately a few microns. Lateral overgrowth from the sides into the $SiO_2$-covered surface occurs due to the growth of the side facets 36 of the deposited $CrO_2$ 35. This lateral overgrowth 37 is substantially defect-free (or at least has a decreased defect density), since the surface below is $SiO_2$ 32, and offers no lattice mismatch since it is amorphous.

Further, since defects propagate upwards on the $CrO_2$ 35 growth in the defective region, no lateral migration of the defects occurs on the overgrown region. FIG. 3C illustrates poor quality directly overgrown $CrO_2$ on $TiO_2$ at reference numeral 38, whereas reference numeral 39 illustrates high quality laterally overgrown $CrO_2$ on $SiO_2$. This is a general technique, and has been successfully employed for the growth of compound semiconductors such as GaAs (e.g., see B. Y. Tsaur et al., *Appl. Phys. Lett.*, V41, 347 (1982); U.S. Pat. Nos. 4,670,088, 4,826,784 and 4,868,633) and GaN. However, such has not been applied for ferromagnetic materials and the present invention clearly is novel in at least this respect.

Thus, using selective area growth, and utilizing the property of lateral overgrowth that arises from selective area growth, high-quality, defect-free $CrO_2$ layers are produced.

Figure 4:
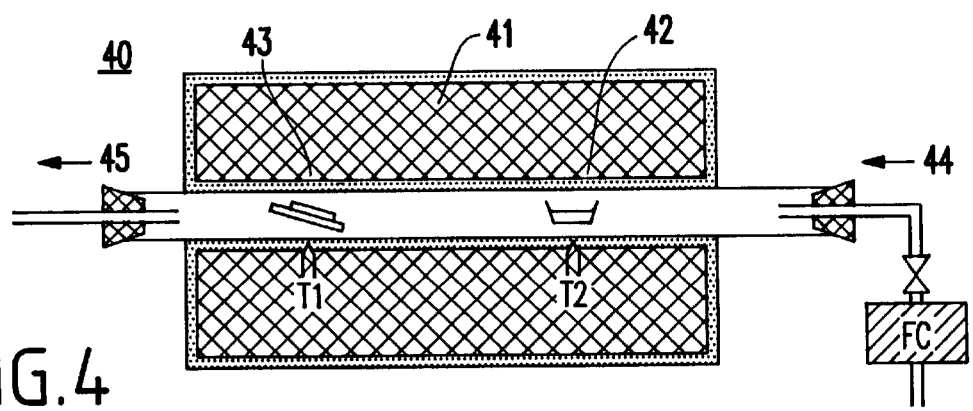
FIG. 4 is a schematic diagram of an atmospheric pressure chemical vapor deposition apparatus.

FIG. 4 shows a schematic of an atmospheric pressure chemical vapor deposition apparatus 40 for practicing the selective area growth according to the present invention. The setup is similar to what has been described by Isibashi et al., mentioned above and incorporated herein by reference.

Apparatus 40 includes a two-zone furnace 41 with a quartz tube. The precursor powder 42 (e.g., $CrO_3$) is placed in a quartz boat in the source zone and the substrates 43 placed on a tilted susceptor placed in the reaction zone. The tilting of the susceptor helps maintain a relatively uniform deposition on the substrates by increasing the flow velocity due to constriction in the channel and thereby thinning the boundary layer. The precursor powder is sublimed and carried to the substrates using oxygen ($O_2$) 44 where it decomposes to form the $CrO_2$ film by evolving oxygen. The temperature of the source zone has been varied between about 250–300° C. and the substrate temperature from about 385–450° C. for different runs. Preferred source temperature is substantially within a range of about 260 to about 270° C., and a preferred substrate temperature is substantially within a range of about 390 to about 420° C. The flow rate of oxygen has similarly been varied between 50–500 cc/min. Reference numeral 45 illustrates an exhaust. A gas flow controller 46 also is provided.

The phase purity and morphology of the films depend on the substrate and source temperatures and the oxygen flow rate, with optimum films (e.g., in terms of phase purity and morphology) being obtained at substrate temperatures of approximately 390 to about 420° C., with source temperature of around 260 to about 270° C. and oxygen flow rate of approximately 100 cc/min.

The present inventors have found that the deposition of $CrO_2$ is highly sensitive to the surface of the substrate on which it is deposited. $CrO_2$ will not deposit on clean, amorphous $SiO_2$ (or amorphous $Si_3N_4$ or a compound of amorphous $SiO_2$ and $Si_3N_4$), but will deposit on a surface of $TiO_2$ or sapphire ($Al_2O_3$), as demonstrated in the following description and as shown in FIGS. 5A–5F.

Figure 5A:
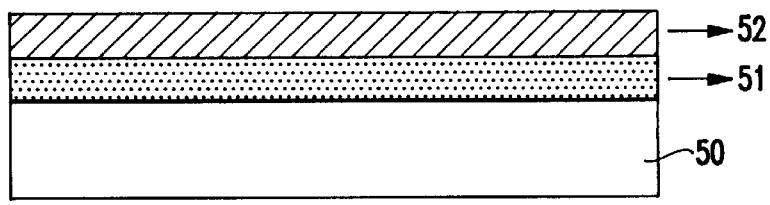
FIGS. 5A, 5B, 5C, 5D, 5E and 5F are schematic diagrams showing a process according to the present invention using the apparatus of FIG. 4.

In FIG. 5A, a substrate including a Si (100) wafer 50 had a $SiO_2$ layer 51 having a thickness of approximately 5000 Å deposited thereon. Then, a Ti film 52 having a thickness of approximately 500 Å, was deposited on top of the silicon dioxide layer 51, as shown in FIG. 5A. A Sn film and/or Ru film can be used instead of or in addition to the Ti film.

Figure 5B:
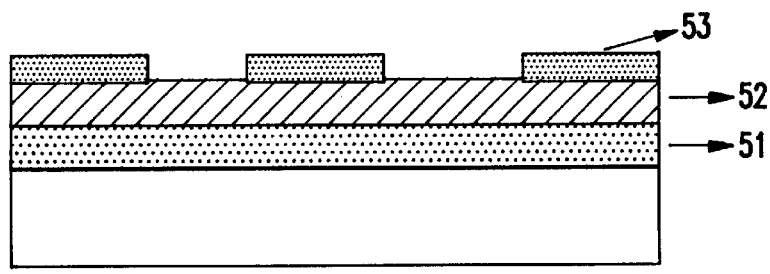
Figure 5C:
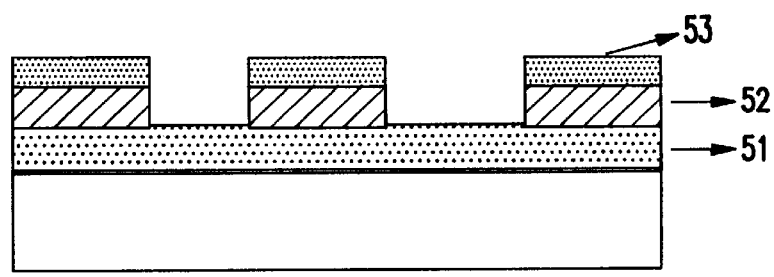

As shown in FIG. 5B, a photoresist 53 was then spun onto this wafer, and the wafer patterned in the form of squares, rectangles, etc. and lines with dimensions ranging from about 1 micron to about 300 microns using standard lithographic procedures. Then, the wafer was placed in a $HNO_3:HF:H_2O$ (1:1:50) solution to etch the Ti, thereby leaving 1–300 micron features of Ti on $SiO_2$, as shown in FIG. 5C.

Figure 5D:
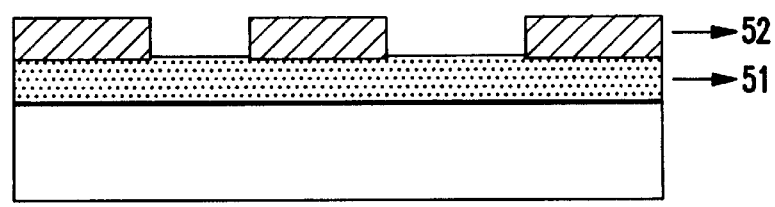

Then, as shown in FIG. 5D, the photoresist 53 was dissolved away in a suitable solvent such as acetone or the like.

Figure 5E:
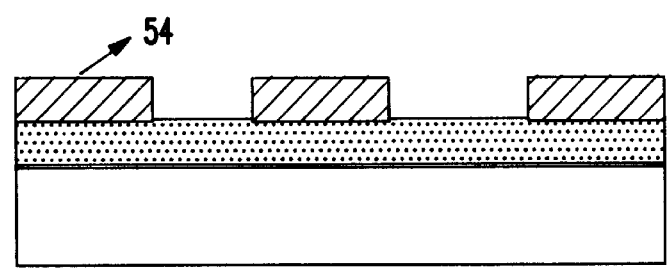

Thereafter, the patterned wafer was given a final acetone clean bath, and inserted into the growth reactor with the substrate heated to approximately 395° C. The source temperature was maintained at approximately 260° C. and the oxygen flow rate was approximately 100 cc/min. Thus, the Ti 52 was converted to $TiO_2$ 54, as shown in FIG. 5E. If Sn and/or Ru are employed, they also would be converted to the oxides.

Figure 5F:
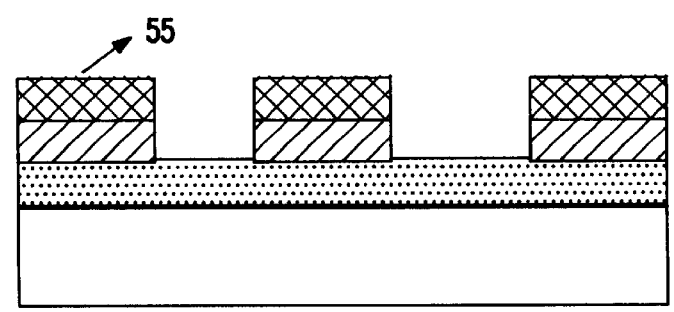

As shown in FIG. 5F, deposition of the $CrO_2$ 55 resulted in preferential growth only on the $TiO_2$ 54 and not on the $SiO_2$ 51. There is no excess $CrO_2$. All the growth occurs on the $TiO_2$-covered surfaces.

After deposition, the wafer was removed from the reactor and studied by scanning electron microscopy (SEM) to reveal the selective area growth.

Figure 6A:
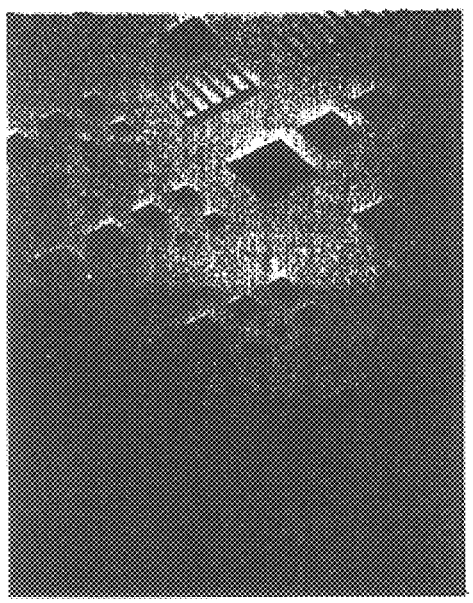
FIGS. 6A, 6B and 6C are scanning electron micrographs (SEMs) showing features of different sizes produced according to the process of the present invention.
Figure 6C:
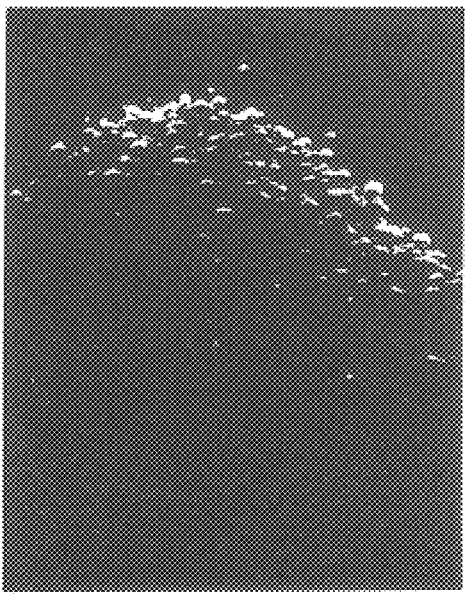
Figure 6B:
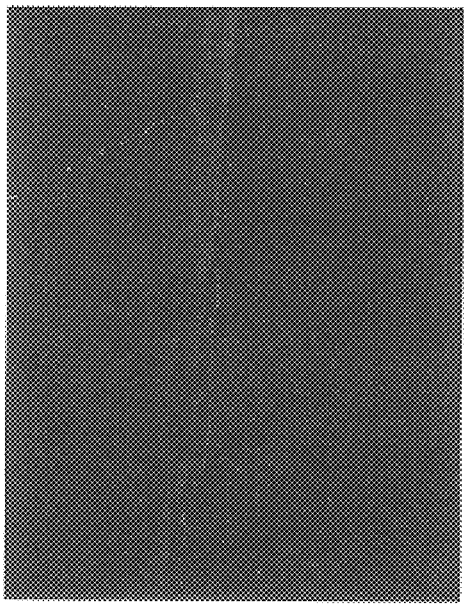

$CrO_2$ was observed not to have been deposited on the $SiO_2$. However, it grew readily on the $TiO_2$ formed by oxidation of the Ti film. This can be seen in the scanning electron micrographs (SEMs) of FIGS. 6A–6C showing that no growth of $CrO_2$ has occurred on the $SiO_2$. FIGS. 6A–6C show features of different sizes.

Figure 6D:
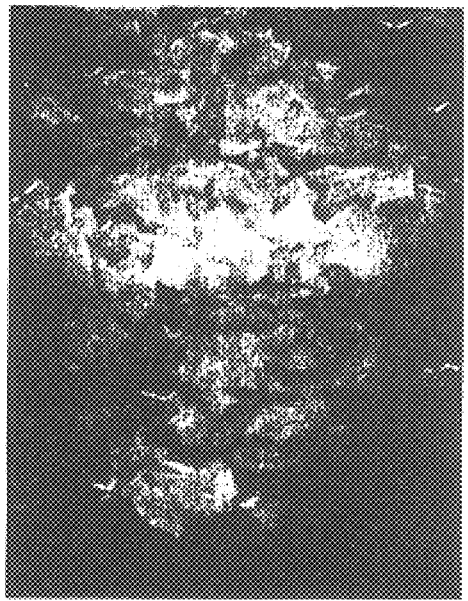
FIG. 6D is an SEM showing the morphology of an epitaxial film which has been blanket-deposited on a sapphire substrate and is for comparison with the SEMs of FIGS. 6A, 6B and 6C for structures produced according to the present invention.

For example FIG. 6A shows a 750 $\mu$m feature size, FIG. 6B shows a 20.0 $\mu$m feature size, and FIG. 6C shows a 4.3 $\mu$m feature size. The bars in the micrograph correspond to the scale from which the feature sizes can be estimated. They are not the actual feature sizes. It is noted that the growth habit occurs only on the patterned areas containing the $TiO_2$ layer. The morphology of an epitaxial film which has been blanket deposited on a sapphire substrate is shown in FIG. 6D for comparison.

A subsequent experiment showed that selective growth of $CrO_2$ on $TiO_2$ could be accomplished even with a Ti layer as thin as 20 Å. Further, the pressure was reduced in the reactor tube down to 10 Torr and selective growth occurred using the same range of temperatures for the source and substrate as for atmospheric pressure growth.

The growth of $CrO_2$ occurs over a narrow window of temperature and flow parameters. Preferably such growth occurs over this narrow window/range, although some selectivity can still be maintained beyond this range. Selective area growth was observed across this entire window of deposition conditions. The selectivity is strongly dependent upon the cleanliness of the $SiO_2$. If there is contamination on the $SiO_2$, $CrO_2$ will deposit upon the contamination and selectivity will be compromised, as shown in the SEM of FIG. 7.

Figure 7:
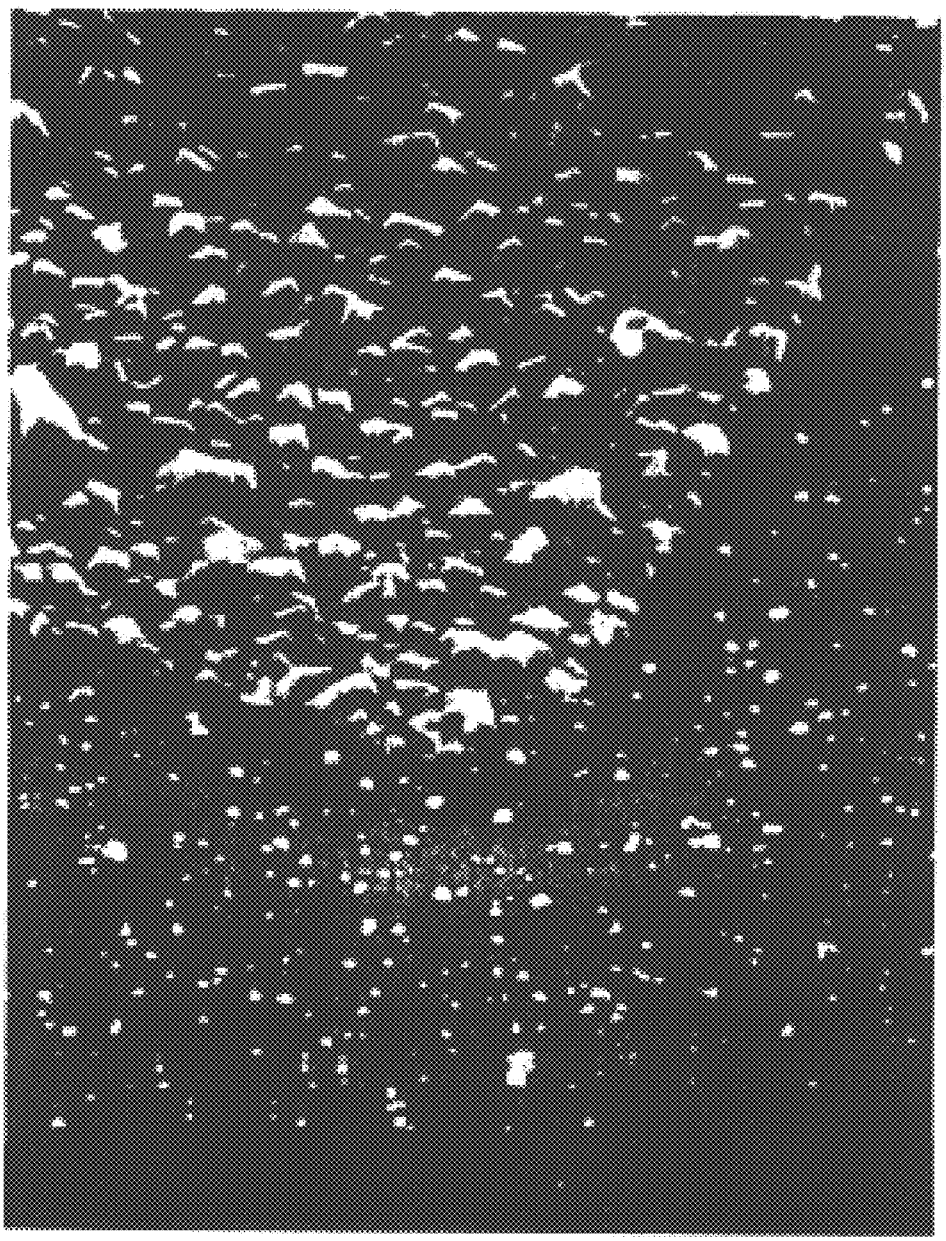
FIG. 7 is an SEM illustrating some nonselectivity in growth due to incomplete cleaning of a surface.
Figure 8A:
FIGS. 8A, 8B, 8C, 8D and 8E are schematic diagrams showing a method using a sapphire substrate according to the present invention.
Figure 8B:
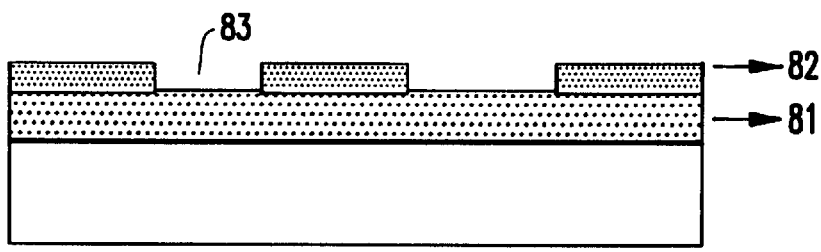
Figure 8C:
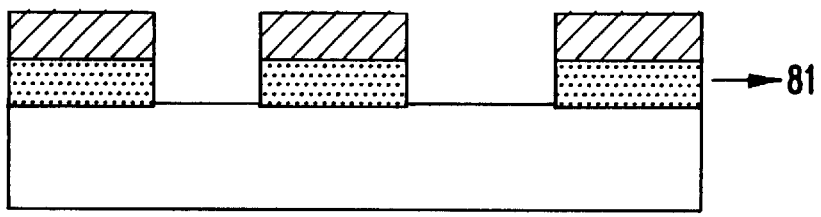
Figure 8D:
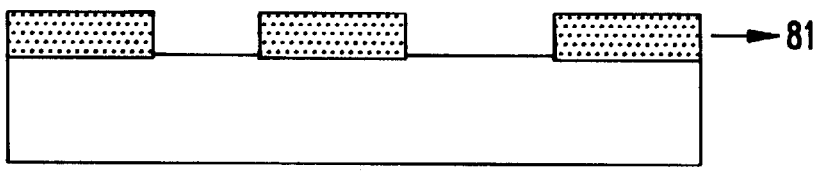
Figure 8E:
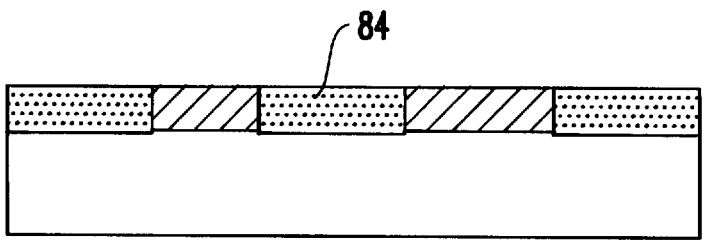
Figure 9A:
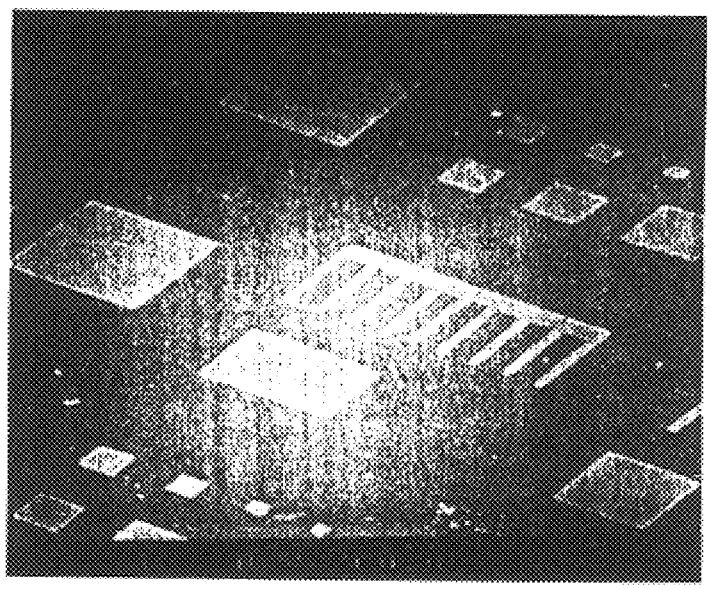
FIGS. 9A, 9B, 9C and 9D are SEMs showing the results of the growth on the sapphire substrate shown in FIGS. 8A–8E.
Figure 9B:
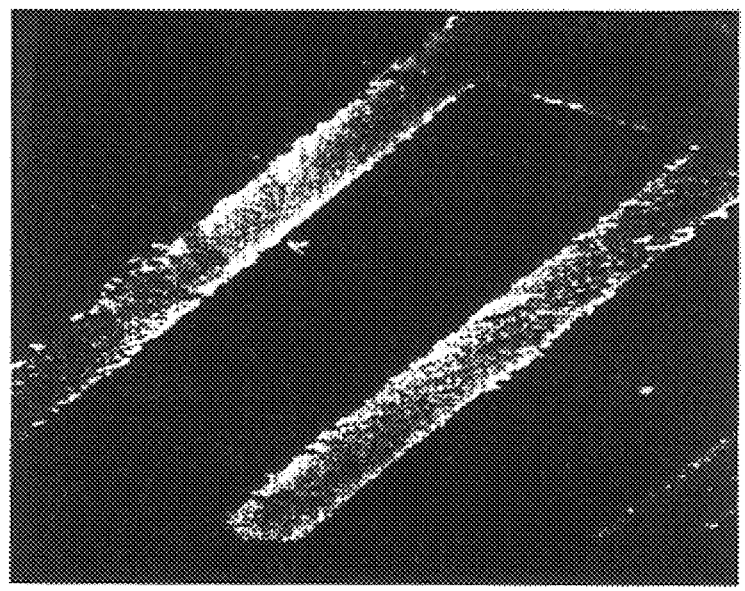
Figure 9C:
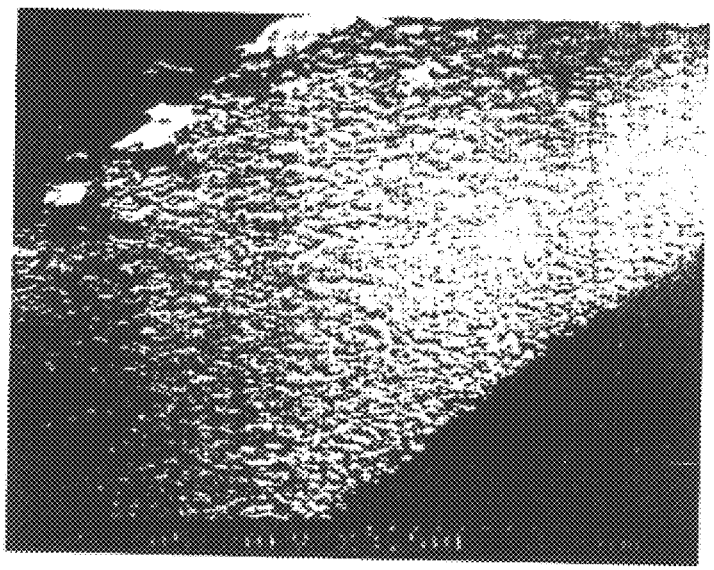
Figure 9D:

In FIG. 7, the $SiO_2$ was contaminated due to incomplete cleaning of the surface. As shown, while there is extensive growth of $CrO_2$ on the $TiO_2$, some deposition also has occurred on the $SiO_2$. $CrO_2$ is a metastable phase, and its successful nucleation is facilitated by the presence of a crystalline template that is close to its crystal structure. This is provided by the $TiO_2$ surface, and not provided by the amorphous $SiO_2$ surface, and hence the selectivity. A $CrO_3$ molecule impinging upon the $SiO_2$ surface will have a long migration length and will subsequently desorb.

In contrast, if there is contamination present, the $CrO_3$ will decompose at the contamination site to form $CrO_2$. On a $TiO_2$ surface, the arriving $CrO_3$ molecule has a short migration length and reacts to form $CrO_2$ due to stabilization of the substrate which acts as a catalyst for the reaction. Because of the epitaxial match with $Al_2O_3$, $CrO_2$ can also be selectively grown on this template.

In the example shown, the $TiO_2$ template was polycrystalline. Hence, the ensuing $CrO_2$ deposit was polycrystalline as well, and the faceted grains can be easily observed in the micrographs of FIGS. 6A–6C and 7. When a single crystal template is used, the microstructure observed is much smoother. For example, this relative smoothness is observed in the case of growth on single crystal non-patterned sapphire substrates as shown in FIG. 6D.

FIGS. 8A–8E illustrate a process according to the present invention in which the substrate used is sapphire (e.g., single crystal sapphire($Al_2O_3$)).

Specifically, FIGS. 8A–8E show where a $SiO_2$ film 81 was deposited on a sapphire substrate, and patterned with a photoresist 82 to open up windows 83 in the $SiO_2$ film for selective area growth using standard photolithographic techniques and wet chemical etching. Unlike the structure shown in FIG. 5, no Ti deposition and subsequent oxidation are performed here since the growth of $CrO_2$ occurs on the sapphire substrate inside the windows 83. Growth of $CrO_2$ 84 is now performed in substantially the same way as was done for the case of growth of $CrO_2$ on $TiO_2$. However, due to the single crystal nature of the sapphire substrate the growth microstructure is far smoother as clearly observed in the SEM micrographs of FIGS. 9A and 9B which show the results of growth on the patterned sapphire substrate 80 shown in FIGS. 8A–8E.

As clearly shown from the SEM micrographs of FIG. 9A–9D, selective area growth has occurred with growth occurring on the exposed sapphire surface, but not on the adjoining $SiO_2$ surface, and the growth is smoother compared to growth on $TiO_2$ since the sapphire surface is single crystal in nature. It is noted that the growth at the edges of the features is not very uniform as compared to the growth away from the edges and this may be related to anomalous behavior of the surface diffusion of the reactant species near the feature edges.

Figure 10A:
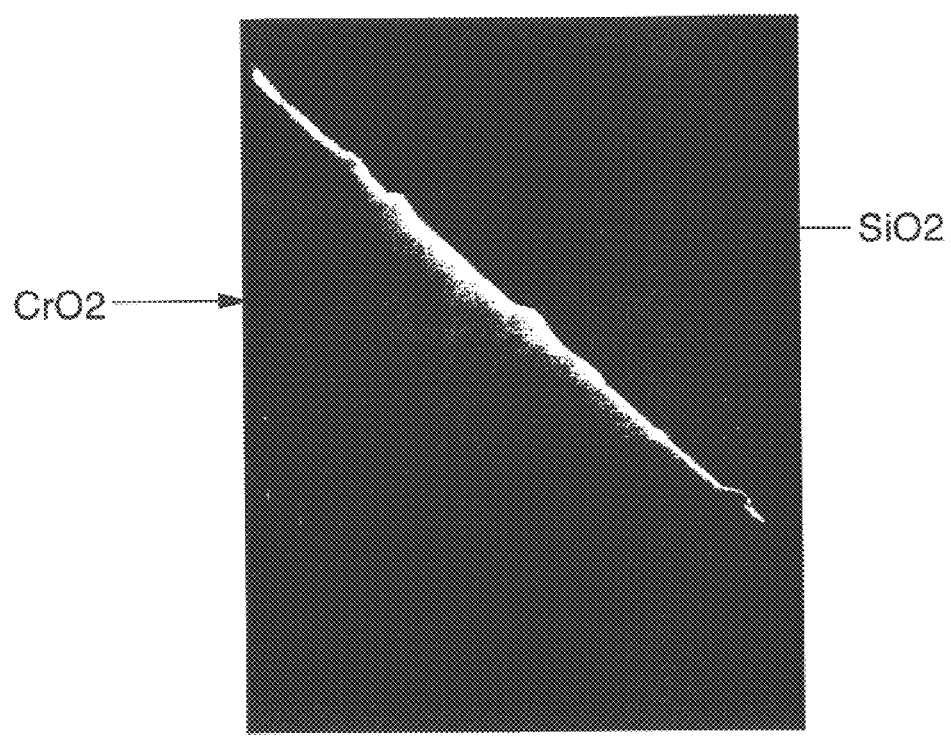
FIGS. 10A and 10B show the result of selective area growth on a $TiO_2$ substrate that has a patterned $SiO_2$ layer on it, and specifically

FIGS. 10A and B show the situation when the growth is performed on single crystal $TiO_2$. In this case, a single crystal $TiO_2$ wafer was coated with 120 nm $SiO_2$ and patterned so as to open up 5-micron- and 10-micron-stripe windows in the $SiO_2$. When $CrO_2$ growth was performed, again as expected, selective area growth was observed as can be seen in the SEM micrograph of FIG. 10A. The growth in this case is of high quality as evidenced from the smooth growth microstructure.

Figure 10B:
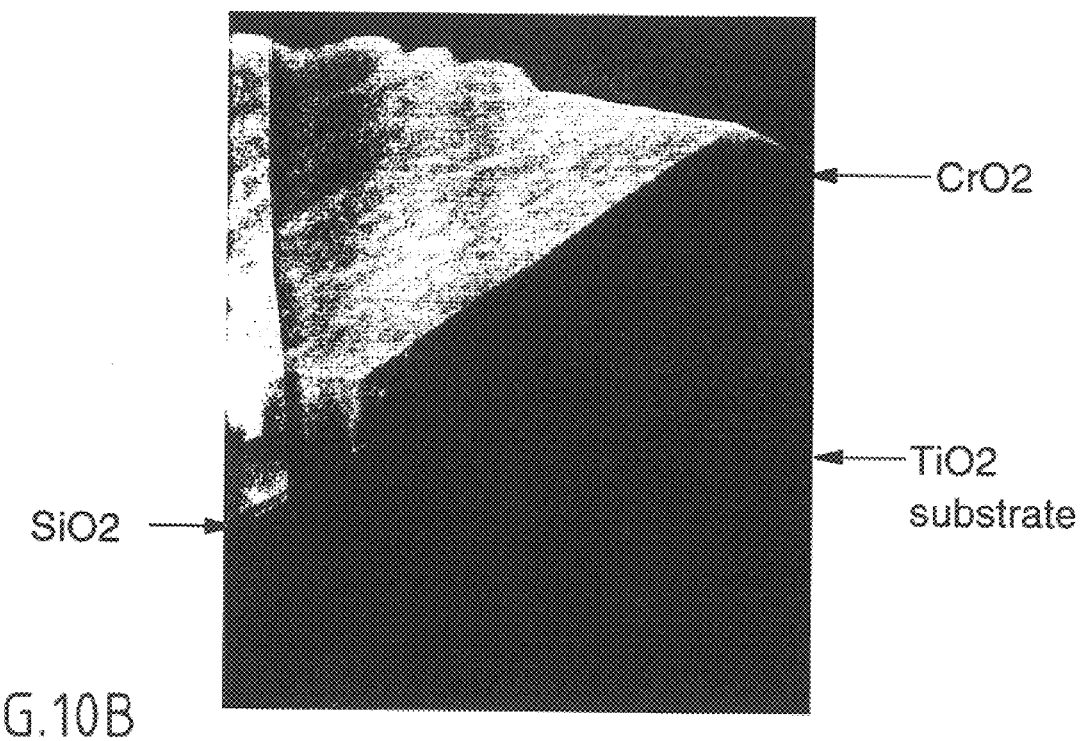

FIG. 10B shows the growth cross-section observed at an angle. Clearly, epitaxial lateral overgrowth, which was described earlier, is observed and the $CrO_2$ penetrates laterally over the $SiO_2$ and from the edge of the stripe at a velocity that is roughly 50% of the growth velocity in the vertical (growth) direction.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. A method of forming a magnetic device, comprising:
   selective area deposition of a ferromagnetic material on a substrate,
   said substrate surface partially covered with material having a crystal structure having at least one symmetry relation with the crystal structure of said ferromagnetic material.
2. The method according to claim 1, wherein said ferromagnetic material is $CrO_2$.
3. The method according to claim 2, wherein at a predetermined temperature of said substrate, said $CrO_2$ grows only on certain surfaces of said substrate and does not form on other surfaces.
4. The method according to claim 3, wherein said substrate comprises one of a single crystal sapphire ($Al_2O_3$) and titanium oxide ($TiO_2$).
5. The method according to claim 2, wherein said substrate includes a crystal structure having a shape one of trigonal, hexagonal, monoclinic, orthorhombic, tetragonal, and cubic.
6. The method according to claim 1, wherein at a predetermined temperature of said substrate, said ferromagnetic material grows only on certain surfaces of said substrate and does not form on other surfaces.
7. The method according to claim 1, wherein said substrate comprises one of a single crystal sapphire ($Al_2O_3$) and titanium oxide ($TiO_2$).
8. The method according to claim 1, wherein a portion of said substrate includes a material that is amorphous.
9. The method according to claim 1, wherein a portion of said substrate comprises one of amorphous $SiO_2$, $Si_3N_4$, and a compound of amorphous $SiO_2$ and $Si_3N_4$.
10. A method of forming a magnetic device, comprising:
    selective area deposition of a ferromagnetic material on a substrate,
    wherein a portion of said substrate contains material that bears a symmetry relation with the ferromagnetic material, and
    wherein said substrate comprises an amorphous material upon which the ferromagnetic material does not grow and which does not share a symmetry relation with the ferromagnetic material.
11. The method according to claim 10, wherein said amorphous material comprises one of $SiO_2$ and $Si_3N_4$.
12. A method of forming a magnetic device, comprising:
    coating a substrate with a ferromagnetic layer;
    depositing an insulating barrier layer on said ferromagnetic layer;
    subsequent to lithographic patterning of said insulating barrier layer, depositing a $SiO_2$ layer;
    opening contact holes in said $SiO_2$ layer to said insulating barrier layer;
    selectively growing a ferromagnetic layer in the contact holes; and
    depositing a metallization layer on the selectively grown ferromagnetic layer.
13. The method according to claim 12, wherein said ferromagnetic material comprises $CrO_2$.
14. The method according to claim 12, wherein said metallization is formed of Au and wherein said substrate comprises a semiconductor substrate.
15. The method according to claim 12, wherein a bottom magnetic electrode of said device includes a $CrO_2$ layer and an insulating barrier layer, said $CrO_2$ layer and said insulating barrier layer being photolithographically patterned and etched prior to the deposition of $SiO_2$ layer and subsequent selective growth of the $CrO_2$ layer and the metallization layer.
16. The method according to claim 12, wherein said insulating barrier layer includes at least one of $TiO_2$ and $Al_2O_3$.
17. The method according to claim 12, wherein said substrate includes an amorphous material upon which the ferromagnetic material does not grow and which does not share a symmetry relation with the ferromagnetic material.
18. The method according to claim 17, wherein said amorphous material comprises one of $SiO_2$, $Si_3N_4$, and a compound of $SiO_2$ and $Si_3N_4$.
19. A method of forming a film, comprising:
    coating a single crystal substrate with a $SiO_2$ layer, said single crystal substrate comprising one of a $TiO_2$ substrate and a sapphire substrate;
    forming a window in the $SiO_2$ layer; and
    selectively growing ferromagnetic material in said window.
20. The method according to claim 19, wherein lateral overgrowth from sides into the $SiO_2$-coated single crystal substrate occurs due to growth of side facets of the ferromagnetic material layer having been deposited.
21. The method according to claim 20, wherein said lateral overgrowth is substantially defect-free.
22. The method according to claim 20, wherein said substrate includes an amorphous material upon which the ferromagnetic material does not grow and which does not share a symmetry relation with the ferromagnetic material.
23. The method according to claim 22, wherein said amorphous material comprises one of $SiO_2$, $Si_3N_4$, and a compound of $SiO_2$ and $Si_3N_4$.

* * * * *